(12) United States Patent
Kim

(10) Patent No.: US 6,559,025 B2
(45) Date of Patent: May 6, 2003

(54) METHOD FOR MANUFACTURING A CAPACITOR

(75) Inventor: Jin-Won Kim, Seoul (KR)

(73) Assignee: Samsung Electronics Co., Ltd., Seoul (KR)

( * ) Notice: Subject to any disclaimer, the term of this patent is extended or adjusted under 35 U.S.C. 154(b) by 0 days.

(21) Appl. No.: 09/909,510

(22) Filed: Jul. 20, 2001

(65) Prior Publication Data

US 2001/0044179 A1 Nov. 22, 2001

Related U.S. Application Data

(62) Division of application No. 09/427,173, filed on Oct. 25, 1999, now Pat. No. 6,265,740.

(30) Foreign Application Priority Data

Mar. 30, 1999 (KR) .............................. 99-10929

(51) Int. Cl.⁷ ....................... H01L 21/20; H01L 21/8242
(52) U.S. Cl. ...................... 438/396; 438/239; 438/240; 438/253
(58) Field of Search .............................. 438/396, 253, 438/239, 240, 3

(56) References Cited

U.S. PATENT DOCUMENTS

| | | | | |
|---|---|---|---|---|
| 5,293,510 A | * | 3/1994 | Takenaka ................. | 257/295 |
| 5,392,189 A | | 2/1995 | Fazan et al. .............. | 361/305 |
| 5,488,011 A | * | 1/1996 | Figura et al. ............. | 438/253 |
| 5,504,041 A | * | 4/1996 | Summerfelt .............. | 438/396 |
| 5,619,393 A | | 4/1997 | Summerfelt et al. ...... | 361/321.1 |
| 5,773,314 A | * | 6/1998 | Jiang et al. .............. | 438/3 |
| 5,801,079 A | * | 9/1998 | Takaishi ................... | 438/396 |
| 6,060,735 A | | 5/2000 | Izuha et al. .............. | 257/295 |
| 6,136,660 A | | 10/2000 | Shen et al. ................ | 438/386 |
| 6,162,744 A | | 12/2000 | Al-Shareef et al. ....... | 438/785 |

OTHER PUBLICATIONS

Y. Kohyama, et al.; "A Fully Printable, Self-aligned and Planarized Stacked Capacitor DRAM Cell Technology for 1Gbit DRAM and Beyond"; 1977 Symposium on VLSI Technology Digest of Technical Papers; 2 pages (PP. 17 and 18).

* cited by examiner

Primary Examiner—Matthew Smith
Assistant Examiner—Lex H. Malsawma
(74) Attorney, Agent, or Firm—Harness, Dickey & Pierce P.L.C.

(57) ABSTRACT

A method for manufacturing a capacitor for a semiconductor device, that method including forming a first insulating layer having a contact hole on a semiconductor substrate and forming a diffusion barrier layer in the contact hole, with the diffusion barrier layer electrically connecting to the semiconductor substrate. Forming a second insulating layer and a third insulating layer sequentially on the first insulating layer, and providing a hole in the second insulating layer and third insulating layer to expose the diffusion barrier layer. Forming a conductive layer on the semiconductor substrate such that the conductive layer covers the inner wall of the hole in the second insulating layer and the third insulating layer. Forming an insulating fill layer that fills the remainder of the hole containing the conductive layer. Removing upper portions of the fill layer until the third insulating layer is exposed but a portion of the fill layer remains in the hole. Removing the third insulating layer to expose the second insulating layer and forming a dielectric layer on the semiconductor substrate, such that the dielectric layer covers remaining portions of the fill insulating layer, the second insulating layer, and the conductive layer, and forming a plate node on the dielectric layer.

14 Claims, 4 Drawing Sheets

US 6,559,025 B2

METHOD FOR MANUFACTURING A CAPACITOR

CROSS REFERENCE TO RELATED APPLICATION

This application is a division of and claims priority from U.S. patent application Ser. No. 09/427,173, filed Oct. 25, 1999 now U.S. Pat. No. 6,265,740, entitled, "Semiconductor Device Capacitor Using A Fill Layer And A Node On An Inner Surface Of An Opening," which claims priority from Korean Patent Application No. 99-10929, filed Mar. 30, 1999.

BACKGROUND OF THE INVENTION

1. Field of the Invention

The present invention relates to semiconductor devices and method for manufacturing semiconductor devices, and more particularly, to a capacitor of a semiconductor device and a manufacturing method thereof.

2. Description of the Related Art

Capacitors of highly integrated memory semiconductor devices, such as a large capacity dynamic random access memory (DRAM) and a ferroelectric random access memory (FRAM), include dielectric layers made of materials such as PZT ($PbZrTiO_3$) and BST ($BaSrTiO_3$), which have a high dielectric constant. Electrodes in these capacitors are often made of a metal from the platinum group or an oxide of a platinum group metal. However, forming and dry etching of platinum group metals and the their oxides often present difficulties. Further, the metals and oxides are prone to react with semiconductor substrates or polysilicon plugs. Accordingly, a diffusion barrier layer is required between the conductive layer and semiconductor materials such as polysilicon.

FIG. 1 illustrates a semiconductor device including a conventional capacitor having a dielectric layer with high dielectric constant. Referring to FIG. 1, a first insulating layer 3 having a contact hole 2 is on a semiconductor substrate 1, and a polysilicon contact plug 5 and a tantalum (Ta) diffusion barrier layer 7 are in contact hole 2. An etch stop layer 9 and a third insulating layer 11 are sequentially formed on first dielectric layer 3 overlying semiconductor substrate 1 and patterned to expose diffusion barrier layer 7 and adjacent portions of first insulating layer 3.

A storage node 13 is on the inner wall of the opening in third insulating layer 11 and on the exposed portions of diffusion barrier layer 7 and first insulating layer 3. A BST dielectric layer 15 is on storage node 13, and a ruthenium (Ru) plate node 17 is on dielectric layer 15.

Diffusion barrier layer 7 suppresses reactions between storage node 13 and contact plug 5. However, in the conventional capacitor of FIG. 1, the storage node 13 is thin, and deposition of dielectric layer 11 or subsequent annealing can oxidize diffusion barrier layer 7 into a $Ta_2O_5$ insulating layer. Thus, the contact resistance between storage node 13 and substrate 1 increases. Further, the chemical mechanical deposition that forms ruthenium storage node 13 leaves an irregular surface morphology, resulting in regions of storage node 13 with concentrated electric fields when the capacitor is in use. These high electric field regions can increase leakage current of the capacitor.

SUMMARY OF THE INVENTION

In accordance with the present invention, a method is provided for manufacturing a capacitor of a semiconductor device. The method includes: forming a first insulating layer having a contact hole on a semiconductor substrate; forming a diffusion barrier layer in the contact hole, wherein the diffusion barrier layer electrically connects to the semiconductor substrate; forming a second insulating layer and a third insulating layer sequentially on the first insulating layer, wherein a hole is formed in the second insulating layer and third insulating layer to expose the diffusion barrier layer; forming a conductive layer on the semiconductor substrate such that the conductive layer covers the inner wall of the hole in the second insulating layer and third insulating layer; forming an insulating fill layer that fills the remainder of the hole containing the conductive layer; removing upper portions of the fill layer until the third insulating layer is exposed but a portion of the fill layer remains in the hole; removing the third insulating layer to expose the second insulating layer; forming a dielectric layer on the semiconductor substrate, wherein the dielectric layer covers remaining portions of the fill insulating layer, the second insulating layer, and the conductive layer; and forming a plate node on the dielectric layer.

Forming the conductive layer on the inner surface of a hole in the insulating layers provides the conductive layer with a smooth surface that is later covered by the dielectric layer. Additionally, the presence's of the second insulating layer between storage electrodes and filling the cavity in the conductive layer prevents diffusion of oxygen and oxidation of the diffusion barrier layer.

BRIEF DESCRIPTION OF THE DRAWINGS

The features and advantages of the present invention will become more apparent by describing in detail particular embodiments with reference to the attached drawings, in which.

Use of the same reference symbols in different figures indicates similar or identical items.

DESCRIPTION OF THE PREFERRED EMBODIMENTS

Figure 1:
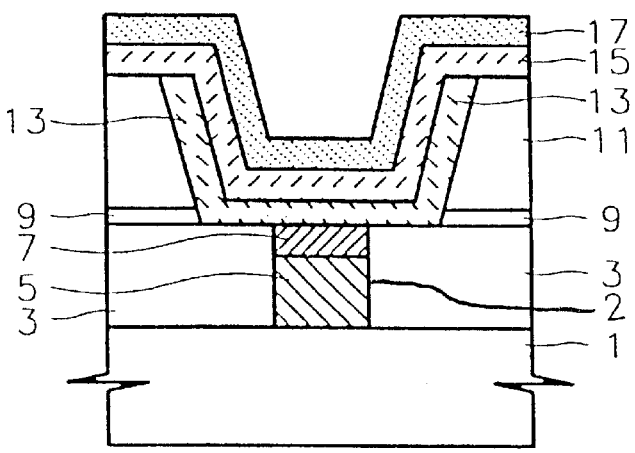
FIG. 1 is a sectional view of a semiconductor device including a conventional capacitor having a dielectric layer with a large dielectric constant.
Figure 2:
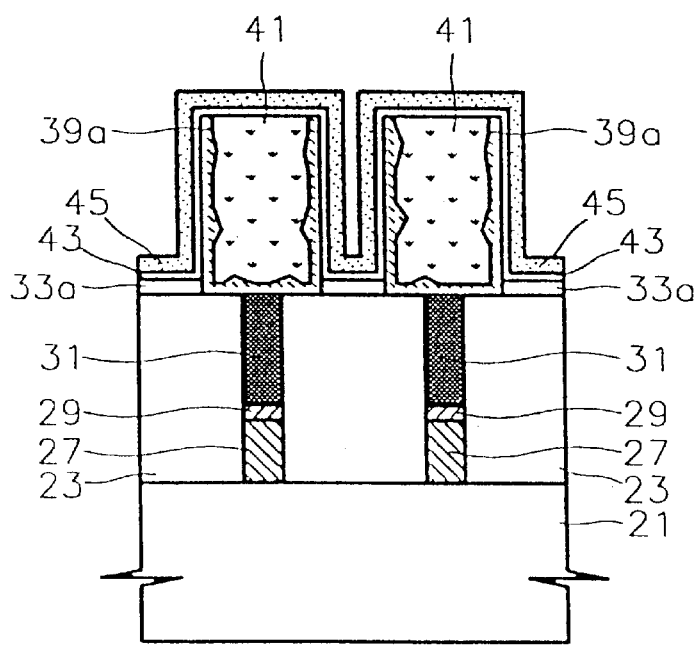
FIG. 2 is a sectional view of a semiconductor device illustrating a capacitor structure of the semiconductor device according to an embodiment of the present invention.

FIG. 2 illustrates a capacitor structure of a semiconductor device in accordance with an embodiment of the present invention. In FIG. 2, an insulating layer 23 having contact holes 25 is on a semiconductor substrate 21. In each contact hole 25, a contact plug 27, an ohmic layer 29 and a diffusion barrier layer 31 are sequentially formed. Contact plug 27 is polysilicon and electrically connects to substrate 21. Ohmic layer 29 is titanium silicide $TiSi_2$. Diffusion barrier layer 31, which prevents a storage node 39a from reacting with contact plug 27 can be a nitride of a refractory metal, e.g., TiN, TiAlN or TiSiN.

A storage node 39a in electrical contact with a corresponding diffusion barrier layer 31 has a uniform outer surface morphology and an inner cavity. Storage nodes 39a are on diffusion barrier layer 31 and insulating layer 23. Storage node 39a is formed of a metal from the platinum group, such as Pt, Ru or Ir, and has a thickness of 100 to 500 Å. A insulating fill layer 41, which includes $SiO_2$, SiN, $Ta_2O_5$, $TiO_2$, or $Al_2O_3$, fills the cavity in storage node 39a. Storage node 39a is on the outer wall of fill layer 41 and has a relatively smooth outer surface. The smooth outer surface decreases leakage current in the capacitor.

A second insulating layer 33a is on insulating layer 23 and between adjacent storage nodes 39a. Second insulating layer 33a prevents oxygen diffusion into insulating layer 23 during forming and annealing a dielectric layer 43. Second insulating layer 33a can be a patterned SiN, $Al_2O_3$, or SiON layer or a patterned composite layer including SiN, $Al_2O_3$ or SiON layers.

Dielectric layer 43 covers fill layer 41, second insulating layer 33a and storage node 39a. Dielectric layer 43 is typically a layer of a material having Perovskite structure such as $(Ba, Sr)TiO_3$, $PbZrTiO_3$, or $(Pb, La)(Zr, Ti)O_3$. Alternatively, a $Ta_2O_5$ layer, an $Al_2O_3$ layer, or a composite layer including a $Ta_2O_5$ layer or an $Al_2O_3$ layer can form dielectric layer 43. A plate node 45, which is a platinum group metal layer, e.g., a Pt, Ru or Ir layer, is on dielectric layer 43.

FIGS. 3 to 9 illustrate a method for manufacturing a capacitor of a semiconductor device according to an embodiment of the present invention.

Figure 3:
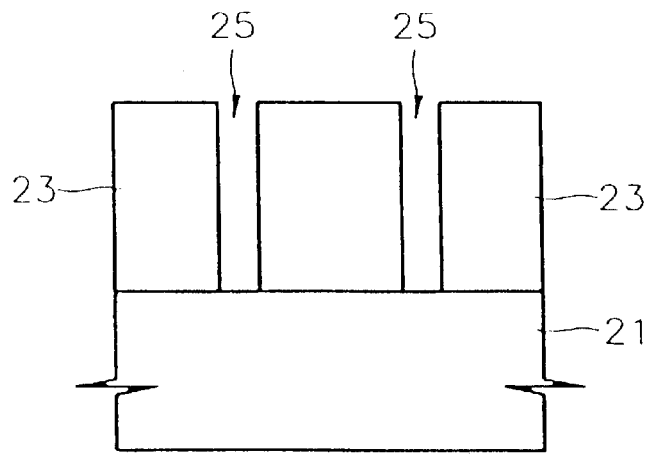
FIGS. 3 to 9 are sectional views of semiconductor structures illustrating a method for manufacturing a capacitor of a semiconductor device according to an embodiment of the present invention.

Referring to FIG. 3, chemical vapor deposition (CVD) forms a first insulating layer 23, which is an oxide layer or a BPSG (boro-phospho-silicate-glass) layer, on a substrate 21, e.g., a silicon substrate. Circuit elements such as transistors (not shown) are typically formed in and on substrate 21 prior to deposition of first insulating layer 23. Photolithography and etching processes selectively remove portions of first insulating layer 23 to form contact holes 25 for electrically connecting underlying circuit elements in and on substrate 21 to storage nodes 39a of capacitors to be formed.

Figure 4:
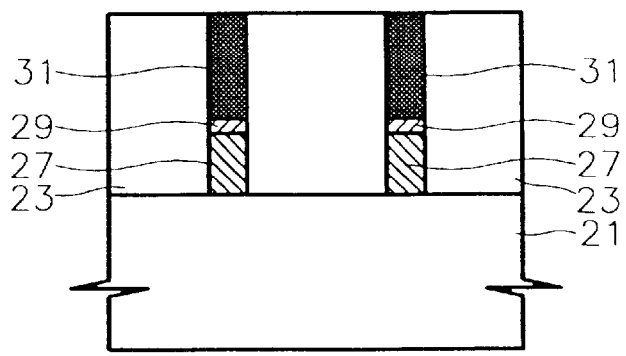

Referring to FIG. 4, a contact plug 27, electrically connected to semiconductor substrate 21, an ohmic layer 29, and a diffusion barrier layer 31 are sequentially formed in contact hole 25. In an exemplary embodiment, contact plug 27 is of polysilicon; ohmic layer 29 is titanium silicide ($TiSi_2$); and diffusion barrier layer 31 is TiN, TiAlN or TiSiN. Diffusion barrier layer 31 prevents subsequently formed storage node 39a from reacting with contact plug 27 or substrate 21. Diffusion barrier layer 31 can avoid oxidation because diffusion barrier layer 31 is buried in contact hole 25. In an alternative embodiment, contact plug 27 is absent, and diffusion barrier layer 31 in the contact hole 25 connects to semiconductor substrate 21.

Figure 5:
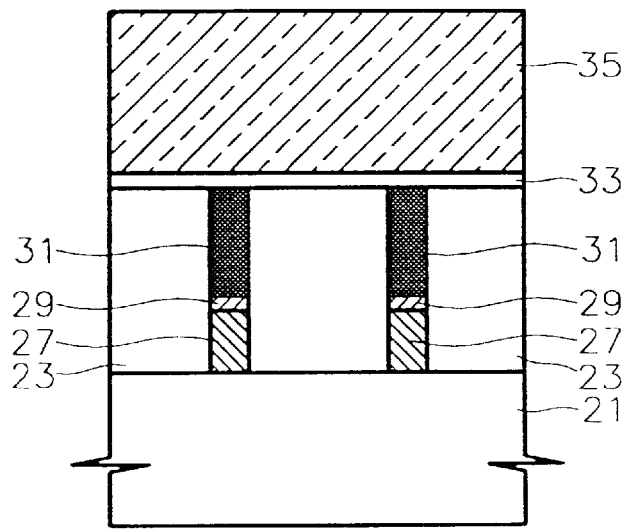

Referring to FIG. 5, a second insulating layer 33 is formed on diffusion barrier layer 31 and first insulating layer 23 to a thickness of 300 to 1,000 Å. Second insulating layer 33 is formed of SiN, $Al_2O_3$, SiON or a combination of SiN, $Al_2O_3$, and SiON. Subsequently, a third insulating layer 35, which is an oxide layer or a BPSG layer, is formed on second insulating layer 33.

Figure 6:
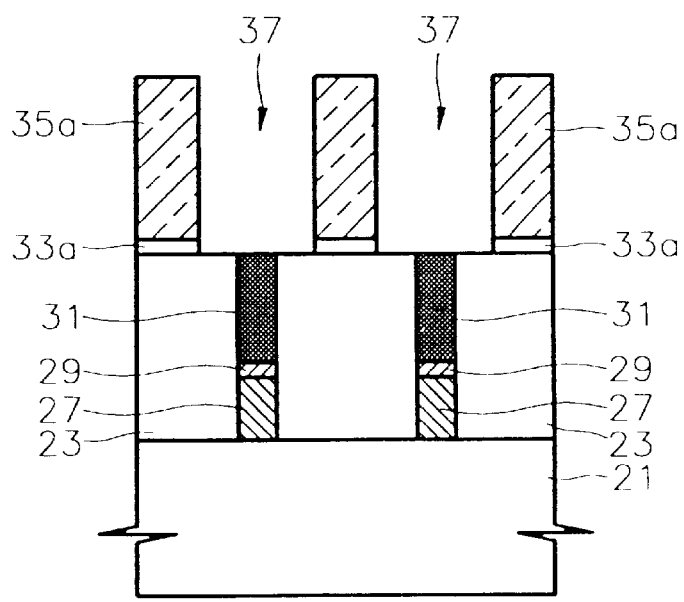

Referring to FIG. 6, photolithography and etching processes pattern third insulating layer 35 so as to expose portions of second insulating layer 33 above contact hole 25. Second insulating layer 33 acts as an etch stopping layer in etching third insulating layer 35. Subsequent patterning of second insulating layer 33 exposes diffusion barrier layer 31 and first insulating layer 23 adjacent to diffusion barrier layer 31. The patterning of third insulating layer 35 and second insulating layer 33 forms holes 37 and leaves patterned layers 35a and 33a.

Figure 7:
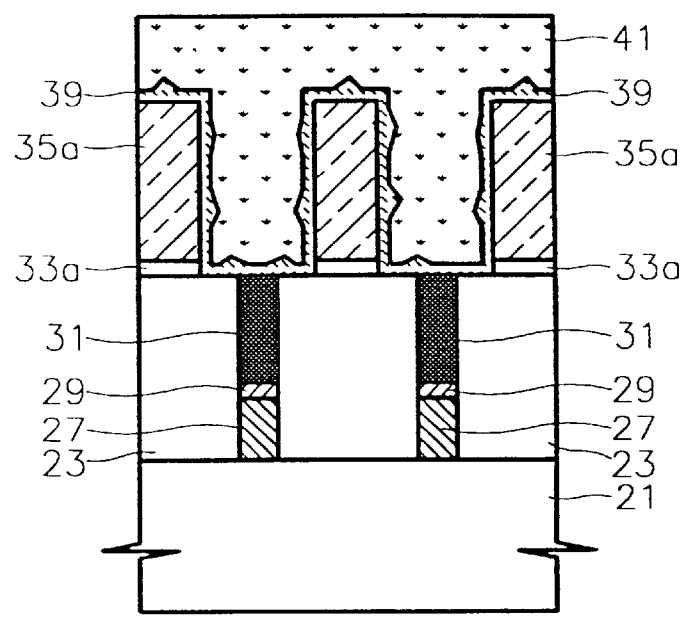

Referring to FIG. 7, chemical vapor deposition forms a 100 to 500-Å thick conductive layer 39, which will form storage nodes 39a of the capacitors. Accordingly, conductive layer 39 covers the inner surface of holes 37 and the top surface of third insulating layer 35a. Conductive layer 39 contains a platinum group metal, e.g., Pt, Ru, or Ir. Conductive layer 39 formed by CVD typically has nonuniform morphology on its top surface. Instead of CVD, physical vapor deposition or electric plating can form conductive layer 39.

On conductive layer 39, chemical vapor deposition forms an insulating fill layer 41 that fills remainder of holes 37. Fill layer 41 contains a material having a high etching selectivity during removal of third insulating layer 35a. For example, fill layer 41 contains $SiO_2$, SiN, $Ta_2O_5$, $TiO_2$, $Al_2O_3$ or a combination thereof when third layer 35a is a BPSG layer, $O_3$ TEOS layer, silicon oxide layer, or another similar layer.

Figure 8:
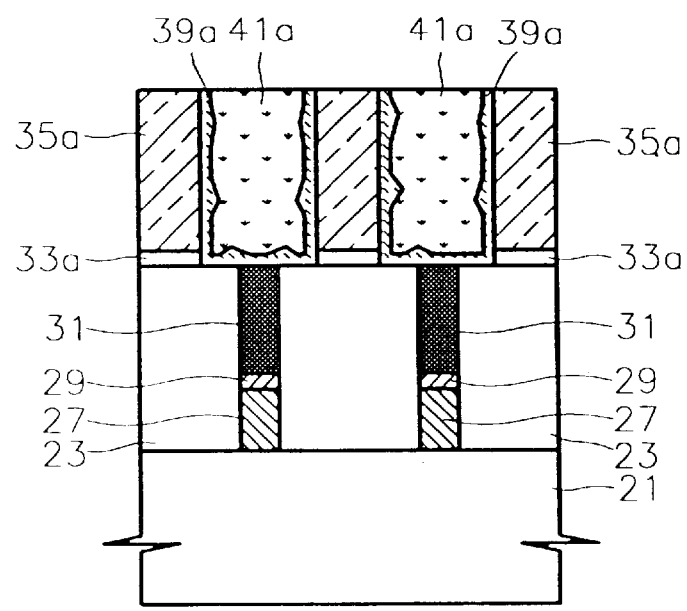

Referring to FIG. 8, chemical mechanical polishing or an etchback process removes upper portions of fill layer 41 and conductive layer 39 to separate areas or portions of patterned layer 35a, conductive layer 39a, and fill layer 41a. The portions of conductive layer 39 within holes 37 are storage nodes 39a of the capacitors.

Figure 9:
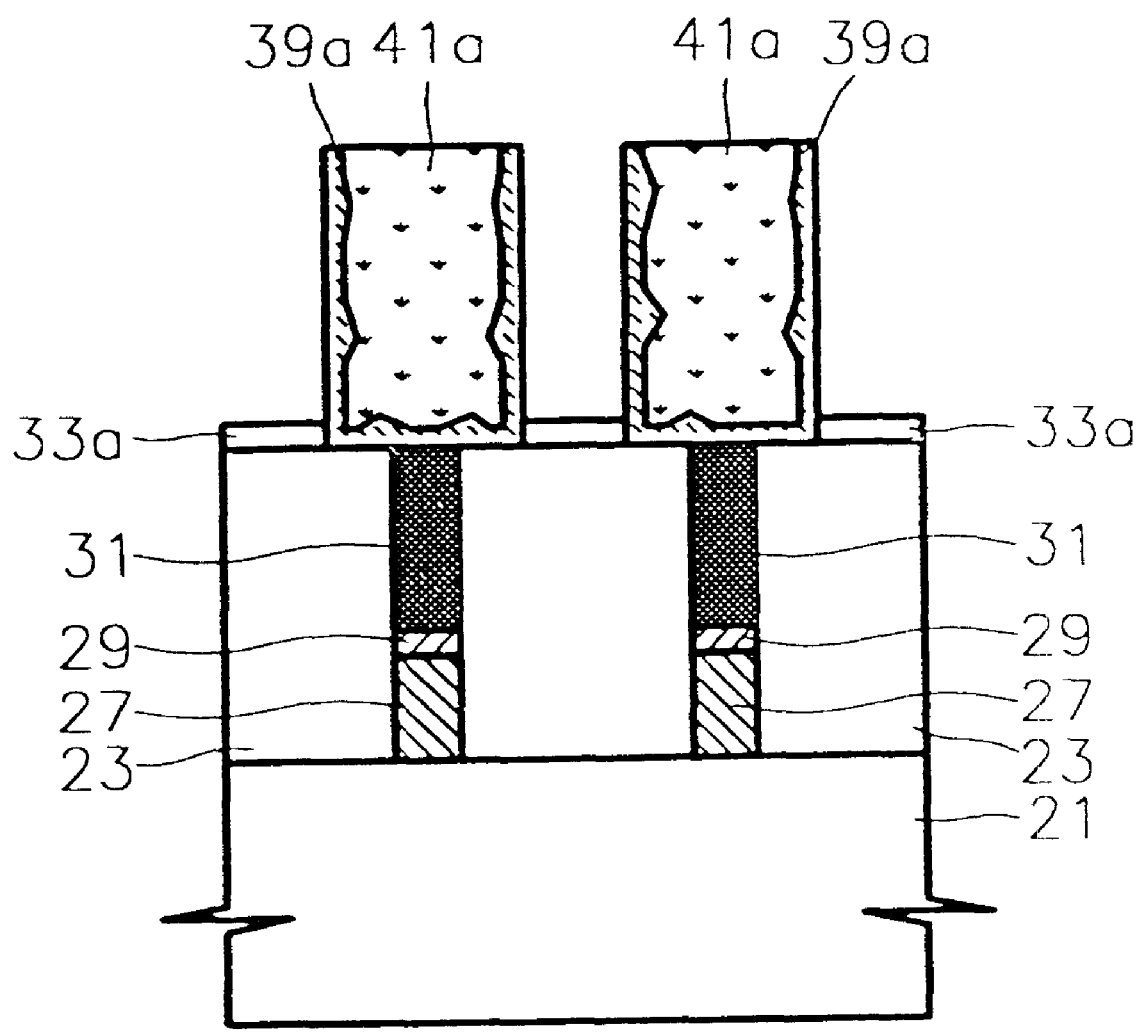

Referring to FIG. 9, wet or dry etching removes third insulating layer 35a to separate adjacent storage nodes 39a but leaves layers 33a and 41a largely intact. Here, second insulating layer 33a and fill layer 41a have a high etching selectivity to the process that removes insulating layer 35a so that third insulating layer 35a can be removed without significantly damaging layers 33a and 41a. In this embodiment, the surfaces of storage nodes 39a, which were formed by filling holes 37, inherit the uniformity the inner walls of holes 37, and this uniformity decreases leakage current of the capacitors.

Finally, as shown in FIG. 2, dielectric layer 43 is formed to a thickness of 50 to 300 Å on the structure of FIG. 9, and annealing under an oxygen atmosphere or oxygen plasma atmosphere at a temperature of 300 to 700° C. enhances the characteristics of dielectric layer 43. Dielectric layer 43 contains: a material having Perovskite structure, such as (Ba, $Sr)TiO_3$, $PbZrTiO_3$ or (Pb, La)(Zr, $Ti)O_3$; $Ta_2O_5$; or $Al_2O_3$. During the annealing, second insulating layer 33a prevents diffusion of oxygen and thereby prevents oxidation of diffusion barrier layer 31. To complete a capacitor, a plate node 45, containing a Pt group metal, e.g., Pt, Ru or Ir, is formed on dielectric layer 43 to a thickness of 100 to 1,000 Å.

As described above, fill layer 41a and forming storage nodes 39a on the walls of holes 37 reduces the roughness of the surface in contact with dielectric layer 43 to thereby reduce the leakage currents in the capacitors. Also, using a structure where the diffusion barrier layer is buried prevents oxidation of diffusion barrier layer 31. Particularly, second insulating layer 33a on insulating layer 23 adjacent to diffusion barrier layer 31 prevents diffusion of oxygen during forming and annealing of dielectric layer 43 to thereby prevent oxidation of diffusion barrier layer 31. Thus, contact resistance remains low. Also, storage node 39a has a wide surface area and a thickness of 100 to 500 Å or less.

Although the invention has been described with reference to particular embodiments, the description is only an example of the inventor's application and should not be taken as a limitation. Various adaptations and combinations of features of the embodiments disclosed are within the scope of the invention as defined by the following claims.

What is claimed is:

1. A method for manufacturing a capacitor of a semiconductor device comprising:

forming a first insulating layer having a contact hole over a semiconductor substrate;

forming a diffusion barrier layer in the contact hole, wherein the diffusion barrier layer electrically connects to the semiconductor substrate;

forming a second insulating layer and a third insulating layer sequentially on the first insulating layer, wherein a hole in the second and third insulating layers exposes the diffusion barrier layer;

forming a conductive layer that covers inner walls of the hole in the second and third insulating layers;

forming a fill layer that fills a remainder of the hole covered by the conductive layer;

removing upper portions of the fill layer and the conductive layer to expose the third insulating layer and leave a storage node of a capacitor;

removing the third insulating layer, whereupon removal of the third insulating layer leaves an outer surface of the storage node with a uniform surface morphology;

forming a dielectric layer that covers the second insulating layer and remaining portions of the fill layer and the conductive layer; and forming a plate node on the dielectric layer.

2. The method of claim 1, wherein forming the second insulating layer and the third insulating layer comprises:

forming the second insulating layer on the first insulating layer;

forming the third insulating layer on the second insulating layer; and forming the hole through the third insulating layer and the second insulating layer to expose the diffusion barrier layer.

3. The method of claim 1, wherein the second insulating layer comprises a material selected from a group consisting of SiN, $Al_2O_3$, SiON, and composites thereof.

4. The method of claim 1, wherein the fill layer comprises a material selected from a group consisting of $SiO_2$, SiN, $Ta_2O_5$, $TiO_2$, and $Al_2O_3$.

5. The method of claim 1, wherein the plate node and the conductive layer are formed of a platinum group metal.

6. The method of claim 5, wherein the platinum group metal is selected from a group consisting of Pt, Ru, and Ir.

7. The method of claim 1, wherein the dielectric layer comprises a material selected from a group consisting of materials having Perovskite structure, $Ta_2O_5$, $Al_2O_3$, and composites thereof.

8. The method of claim 7, wherein the materials having Perovskite structure comprise (Ba, Sr)$TiO_3$, $PbZrTiO_3$, and (Pb, La)(Zr, Ti)$O_3$.

9. The method of claim 1, further comprising forming a contact plug in the contact hole, wherein the contact plug electrically connects to the semiconductor substrate, and the diffusion barrier layer is formed on the contact plug.

10. The method of claim 1, further comprising annealing a structure including the dielectric layer under an oxygen atmosphere or an oxygen plasma atmosphere.

11. A method for manufacturing a capacitor of a semiconductor device comprising:

forming a first insulating layer and a second insulating layer over a doped semiconductor substrate;

forming a hole in the first insulating layer and second insulating layer, thereby exposing a surface of the doped semiconductor substrate;

forming a conductive layer that covers the inner walls of the hole in the first and second insulating layers and the exposed surface of the doped semiconductor substrate;

forming a fill layer that fills a remainder of the hole covered by the conductive layer;

removing upper portions of the fill layer and the conductive layer to expose the second insulating layer;

removing the second insulating layer, whereupon removal of the second insulating layer exposes an outer surface of the conductive layer with a uniform surface morphology, said conductive layer forming a first plate of a capacitor;

forming a dielectric layer that covers the first insulating layer and remaining portions of the fill layer and the outer surface of the conductive layer; and forming a second conductive plate on the dielectric layer.

12. The method of claim 11, wherein the second insulating layer comprises a material selected from a group of SiN, $Al_2O_3$, SIGN, and composites thereof, the fill layer comprises a material selected from a group of $SiO_2$, SiN, $Ta_2O_5$, $TiO_2$, and $Al_2O_3$, and the second conductive plate and the conductive layer are formed of a platinum group metal.

13. A method of making a capacitor of a semiconductor device, said method comprising:

providing a semiconductor substrate including a buried transistor electrically coupled to an incomplete storage node by a conductive plug extending through a first dielectric layer on said semiconductor substrate, said storage node comprising a body having vertical sidewalls, said vertical sidewalls having an exterior surface with a uniform surface morphology, wherein an inner region of the storage node within the vertical sidewalls is filled with an insulative fill layer;

depositing a second dielectric layer over the entire exterior surface of the vertical sidewalls of the storage node and over an exposed planar surface of the fill layer; and forming a conductive plate layer over the second dielectric layer, whereby the exterior surface of the vertical sidewalls of the storage node are an opposite plate of the capacitor.

14. The method of claim 11, wherein the semiconductor substrate so provided includes a third dielectric layer surrounding the storage node and overlaying the first dielectric layer.

* * * * *